(12) United States Patent
Dong

(10) Patent No.: US 9,196,339 B2
(45) Date of Patent: Nov. 24, 2015

(54) RESISTANCE-BASED MEMORY CELLS WITH MULTIPLE SOURCE LINES

(71) Applicant: QUALCOMM Incorporated, San Diego, CA (US)

(72) Inventor: Xiangyu Dong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 14/041,868

(22) Filed: Sep. 30, 2013

(65) Prior Publication Data

US 2015/0092479 A1 Apr. 2, 2015

(51) Int. Cl.
| | |
|---|---|
| *G11C 11/16* | (2006.01) |
| *G11C 7/10* | (2006.01) |
| *G11C 8/16* | (2006.01) |
| *G11C 11/00* | (2006.01) |
| *G11C 11/56* | (2006.01) |
| *G11C 13/00* | (2006.01) |
| *G11C 17/02* | (2006.01) |
| *G11C 17/14* | (2006.01) |

(52) U.S. Cl.
CPC .......... *G11C 11/1673* (2013.01); *G11C 7/1075* (2013.01); *G11C 8/16* (2013.01); *G11C 11/005* (2013.01); *G11C 11/16* (2013.01); *G11C 11/56* (2013.01); *G11C 11/5671* (2013.01); *G11C 13/0002* (2013.01); *G11C 17/02* (2013.01); *G11C 17/14* (2013.01); *G11C 2213/74* (2013.01); *G11C 2213/79* (2013.01)

(58) Field of Classification Search
CPC ..... G11C 11/16; G11C 13/0069; G11C 13/004
USPC .................................................. 365/158, 148
See application file for complete search history.

(56) References Cited

U.S. PATENT DOCUMENTS

| | | | |
|---|---|---|---|
| 6,917,540 B2 * | 7/2005 | Ooishi | 365/173 |
| 8,018,759 B2 * | 9/2011 | Kano et al. | 365/158 |
| 2008/0165573 A1 | 7/2008 | Nirschl et al. | |
| 2010/0118602 A1 | 5/2010 | Carter et al. | |
| 2011/0049656 A1 * | 3/2011 | Li et al. | 257/421 |
| 2012/0155146 A1 | 6/2012 | Ueda et al. | |
| 2012/0327701 A1 | 12/2012 | Nazarian | |
| 2013/0148405 A1 | 6/2013 | Kang et al. | |
| 2013/0155763 A1 | 6/2013 | Alam et al. | |

OTHER PUBLICATIONS

International Search Report and Written Opinion for International Application No. PCT/US2014/056210, ISA/EPO, Dec. 19, 2014, 13 pages.
Lee, D. et al., "R-MRAM: A ROM-Embedded STT MRAM Cache," IEEE Electron Device Letters, Oct. 2013, vol. 34, No. 10, IEEE, Piscataway, NJ, pp. 1256-1258.

* cited by examiner

*Primary Examiner* — Hoai V Ho
*Assistant Examiner* — Tri Hoang
(74) *Attorney, Agent, or Firm* — Toler Law Group, PC

(57) ABSTRACT

In a particular embodiment, a device includes a resistance-based memory cell having multiple source lines and multiple access transistors. A coupling configuration of the multiple access transistors to multiple source lines encodes a data value.

25 Claims, 10 Drawing Sheets

| | WL0 | WL1 | SL0 | SL1 | BL |
|---|---|---|---|---|---|
| 402 RAM Read | Vdd | Vdd | Gnd | Gnd | Vread |
| 404 RAM Write 0 | Vdd | Vdd | Vdd | Vdd | Gnd |
| 406 RAM Write 1 | Vdd | Vdd | Gnd | Gnd | Vdd |
| 408 ROM Read | Gnd | Vdd | Vread | Gnd | Gnd |

RESISTANCE-BASED MEMORY CELLS WITH MULTIPLE SOURCE LINES

I. FIELD

The present disclosure is generally related to resistance-based memory devices.

II. DESCRIPTION OF RELATED ART

Resistance-based memory, such as magnetoresistive random-access memory (MRAM), may be used as non-volatile random-access memory. An MRAM device may store data using magnetic (magnetoresistive) storage elements referred to as magnetic tunnel junction (MTJ) elements. The MTJ elements are formed from two ferromagnetic layers separated by an insulating layer. One of the two layers may be magnetized to a fixed polarity while the other layer can have its magnetic polarization changed by applying a magnetic field to the layer via a write line in a conventional MRAM configuration, or by applying a write current to the MTJ in a spin torque transfer MRAM (STT-MRAM) configuration. Each MTJ element and its associated circuitry (e.g., an access transistor) may form an MRAM cell that stores one bit of information.

Data may be read from an MRAM cell based on electrical resistance of the MRAM cell. A particular MRAM cell can be selected by biasing an associated access transistor that enables current to flow from a source line through the cell's MTJ. The electrical resistance of the MRAM cell depends on the orientation of the fields in the two magnetic layers. By measuring the read current through the MTJ (e.g., by comparing the read current to a reference current), the MTJ can be determined to be in a parallel state where the two magnetic layers have the same polarity and the cell exhibits a lower resistance (e.g., a logical 1) or in an anti-parallel state where the two magnetic layers are of opposite polarity and the MTJ exhibits a higher resistance (e.g., a logical 0).

III. SUMMARY

System and methods of encoding data using a coupling configuration of resistance-based memory cells to encode a value are disclosed. A resistance-based memory cell may have multiple access transistors. The coupling configuration of the multiple access transistors to multiple source lines encodes a data value. For example, when a first access transistor of the multiple access transistors is coupled to a first source line and a second access transistor of the multiple access transistors is coupled to a second source line, the coupling configuration corresponds to a first data value. When the first access transistor is coupled to the second source line and the second access transistor is coupled to the first source line, the coupling configuration corresponds to a second data value.

In another particular embodiment, a method for reading data includes biasing, at a resistance-based memory cell, at least one of a first source line or a second source line relative to a bit line. The method also includes activating, at the resistance-based memory cell, a first access transistor of the resistance-based memory cell. The resistance-based memory cell is coupled to the first source line, to the second source line, and to the bit line. The method further includes detecting, at the resistance-based memory cell, a data value based on whether the first access transistor enables a read current to flow through the resistance-based memory cell.

In another particular embodiment, a device includes means for biasing, at a resistance-based memory cell, at least one of a first source line or a second source line relative to a bit line. The device also includes means for activating, at the resistance-based memory cell, a first access transistor of a resistance-based memory cell. The resistance-based memory cell is coupled to the first source line, to the second source line, and to the bit line. The device further includes means for detecting, at the resistance-based memory cell, a data value based on whether the first access transistor enables a read current to flow through the resistance-based memory cell.

In another particular embodiment, a computer readable storage device stores instructions that are executable by a processor to perform operations including biasing, at a resistance-based memory cell, at least one of a first source line or a second source line relative to a bit line. The operations also include activating, at the resistance-based memory cell, a first access transistor of a resistance-based memory cell, where the resistance-based memory cell is coupled to the first source line, to the second source line, and to the bit line. The operations further include detecting, at the resistance-based memory cell, a data value based on whether the first access transistor enables a read current to flow through the resistance-based memory cell.

One particular advantage provided by at least one of the disclosed embodiments is an ability to provide a resistance-based memory cell that is useable as a random-access memory (RAM) cell based on a state of a resistive element and that is also useable as a read-only memory (ROM) cell.

Other aspects, advantages, and features of the present disclosure may become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
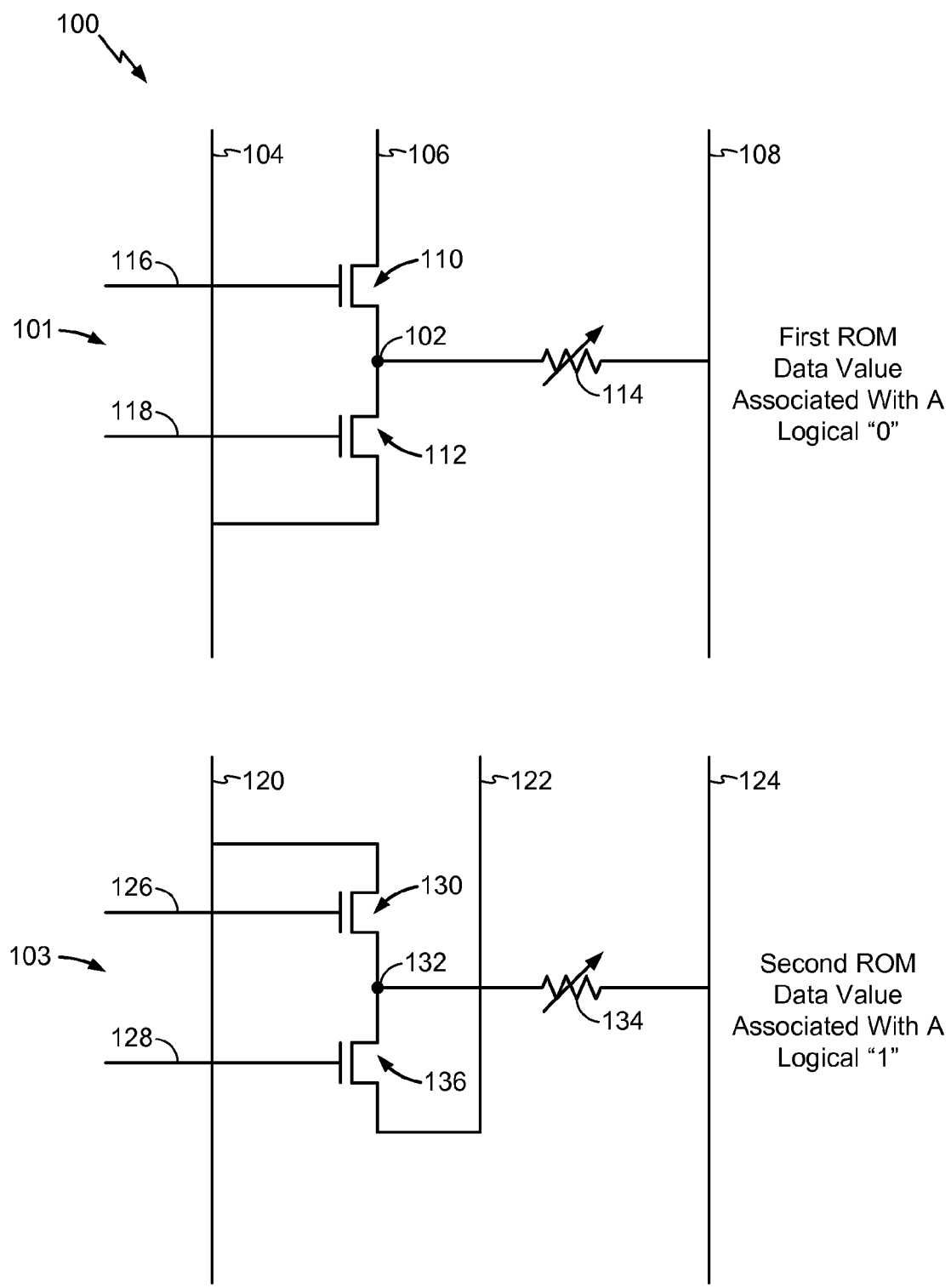
FIG. 1 is a diagram of two particular illustrative embodiments of resistance-based memory cells configured to encode data values.

FIG. 1 illustrates a particular embodiment 100 of a resistance-based memory cell 101 and a resistance-based memory cell 103. The resistance-based memory cell 101 is coupled to a word line 116 and to a word line 118. The word line 116 is coupled to a gate of a first access transistor 110, and the word line 118 is coupled to a gate of a second access transistor 112. A source line 104 is coupled to a first terminal of the second access transistor 112, and a source line 106 is coupled to a first terminal of the first access transistor 110. A second terminal of the first access transistor 110 is coupled to a resistance-based memory element 114 (e.g., a magnetic tunnel junction (MTJ)) at a node 102. A second terminal of the second access transistor 112 is also coupled to the MTJ element 114 at the node 102. The MTJ element 114 is coupled to a bit line 108 to enable current to flow between the node 102 and the bit line 108 via the MTJ element 114. The resistance-based memory cell 101 is configured to store data corresponding to a random access memory (RAM) data value based on the state of the MTJ element 114.

When the resistance-based memory cell 101 is used as a RAM resistance-based memory cell, the source line 104 and the source line 106 may be driven or set at a same voltage and/or current, such as by coupling the source line 104 and the source line 106 together. An amount of read current through the MTJ element 114 can be compared to a reference current to determine a RAM data value corresponding to a state of the MTJ element. The MTJ element 114 may have a relatively high resistance, corresponding to a first RAM data value which may correlate to a logical 0 state, or a relatively low resistance corresponding to a second RAM data value which may correlate to a logical 1 state. Current through a MTJ element resulting from a read voltage being applied across a MTJ cell via one or more activated access transistors is referred to as "read current." Read current that represents a logical 1 state of the MTJ element may be identified as being in a first range of current values (e.g., due to process, voltage, and/or temperature variations) and read current that represents a logical 0 state of the MTJ element may be identified as being within a second range of current values.

Changing the state of the MTJ element 114 corresponds to writing a data value to the resistance-based memory cell 101. To change the state of the MTJ element 114, the word line 116 and the word line 118 are used to bias the gate of the first access transistor 110 and the gate of the second access transistor 112, respectively. The activated first access transistor 110 and the activated second access transistor 112 allow write current to flow through the MTJ element 114, which may cause a state change of the MTJ element 114. "Write current" refers to current having sufficient magnitude to change a state of a MTJ element and is greater than read current (read current does not disturb the state of the MTJ element).

In addition to the RAM value based on the state of the MTJ element 114, the resistance-based memory cell 101 may store read-only data based on a coupling configuration of the source line 104 and the source line 106 to the resistance-based memory cell 101. In an embodiment, when the resistance-based memory cell 101 is used as a ROM cell (i.e., is being read in a ROM operating mode), the source line 104 may be set to a read voltage, and the source line 106 and the bit line 108 may be set to ground. Setting the source line 106 and the bit line 108 to ground (or other common voltage) may include coupling the source line 106 and the bit line 108 together.

In an embodiment, when the ROM data value is read from the resistance-based memory cell 101, the word line 116 is biased to deactivate the access transistor 110 and the word line 118 is biased to activate the access transistor 112 to enable current flow through the access transistor 112. If a current is detected at the bit line 108 (e.g., a current having a magnitude that exceeds a threshold), then the resistance-based memory cell 101 may be determined to store a first logical value, such as a logical 0. If a current is not detected at the bit line 108 (e.g., there is no current detected or the current's magnitude is below a threshold), then the resistance-based memory cell 101 may be determined to store a second logical value, such as a logical 1. Alternatively, current may be detected at the source line 106 (or the source line 104) in addition to or instead of being detected at the bit line 108.

A coupling configuration correlating to a different ROM value, as shown in the resistance-based memory cell 103, couples the source line 120 and the source line 122 to access transistors in a different order as compared to the resistance-based memory cell 101. The resistance-based memory cell 103 is coupled to a word line 126 and a word line 128. The word line 126 is coupled to a gate of a first access transistor 130, and the word line 128 is coupled to a gate of a second access transistor 136. A source line 120 is coupled to a first terminal of the first access transistor 130, and a source line 122 is coupled to a first terminal of the second access transistor 136. A second terminal of the first access transistor 130 is coupled to a resistance-based memory element (e.g., an MTJ) element 134 at a node 132. A second terminal of the second access transistor 136 is also coupled to the node 132. The MTJ element 134 is coupled to a bit line 124 to enable current to flow between the node 132 and the bit line 124 via the MTJ element 134. The resistance-based memory cell 103 is configured to store data based on the state of the MTJ element 134.

Operation of the resistance-based memory cell 103 may be responsive to a mode control signal, such as from a processor or controller, and the resistance-based memory cell 103 may be used as a RAM resistance-based memory cell (in a RAM operating mode) and may be used as a ROM resistance-based memory cell (in a ROM operating mode) in a similar manner as described with respect to the resistance-based memory cell 101. However, because the first access transistor 130 is coupled to the first source line 120 and the second access transistor 136 is coupled to the second source line 122, the value read from the resistance-based memory cell 103 in the ROM operating mode (e.g., a logical 1) is different than the value read from the resistance-based memory cell 101 in the ROM operating mode (e.g., a logical 0).

The coupling configuration of the source lines to a resistance-based memory cell encodes a ROM data value of the resistance-based memory cell by enabling or disabling a current path through the MTJ element in a ROM operating mode. Therefore, the coupling configuration determines whether the resistance-based memory cell is read, in the ROM mode, as having a first binary value (e.g., a logical "0" value for the resistance-based memory cell 101) or a second binary value (e.g., a logical "1" value for the resistance-based memory cell 103).

The ROM data values of the coupling configuration of the resistance-based memory cell 101 and the coupling configuration of the resistance-based memory cell 103 may be set when the circuitry for the resistance-based memory cells 101 and 103 is laid out for use in a device. As a result, the ROM data values associated with each of the resistance-based memory cells 101 and 103 may not be programmable once embodied in a silicon integrated circuit or other semiconductor device. The ROM data values may be set and/or changed during a design phase and/or as represented in electronic computer-aided design (CAD) files representing the resistance-based memory cells 101 and 103.

Although the resistance-based memory cell 101 and the resistance-based memory cell 103 are depicted with two access transistors coupled to two source lines, in other embodiments a resistance-based memory cell may include more than two access transistors coupled to more than two source lines to store more than one ROM value. For example, a third access transistor may be coupled to a third source line.

Each of the resistance-based memory cells 101 and 103 is usable to store two values per resistance-resistance memory cell, effectively doubling usable memory density as compared to single-bit resistance-based memory cells. A portion of the values may be stored as ROM values, and a portion may be stored as RAM values. ROM values stored in the resistance-based memory cell 101 and/or the resistance-based memory cell 103 may encode data for tables for mathematical functions, such as trigonometric function tables or fast Fourier transform (FFT) coefficient tables, as described in further detail with respect to FIG. 9. Since each resistance-based memory cell can hold a RAM data value and a ROM data value simultaneously (e.g., the RAM value indicated by the state of the MTJ element and the ROM value indicated by the coupling configuration), the useable data density of a memory array formed of resistance-based memory cells such as the resistance based memory cells 101 and 103 is increased when compared to single-bit resistance-based memory cells. A resistance-based memory array formed of resistance-based memory cells such as the resistance based memory cells 101 and 103 may form an array of ROM values as well as an array of RAM values and may reduce the use of circuit board space and/or integrated circuit die area, which may be useful in SoC ("system on a chip") designs and other applications where memory array space is at a premium.

Figure 2:
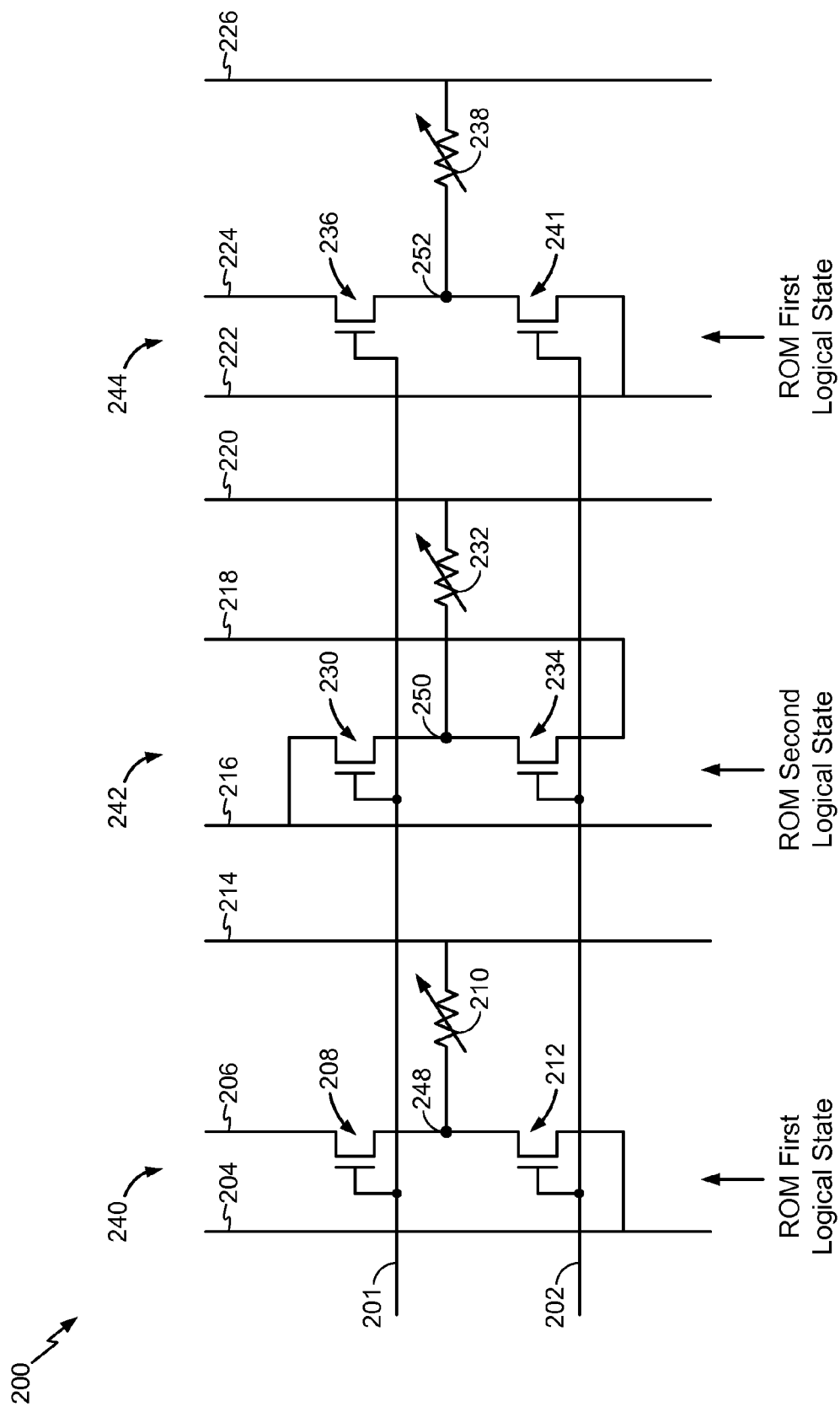
FIG. 2 is a diagram of a particular embodiment of resistance-based memory cells configured to encode data values.

FIG. 2 illustrates a portion of a resistance-based memory device 200 that includes a first resistance-based memory cell 240, a second resistance-based memory cell 242, and a third resistance-based memory cell 244. The first resistance-based memory cell 240 is coupled to source lines 204, 206, the second resistance-based memory cell 242 is coupled to source lines 216, 218, and the third resistance-based memory cell 246 is coupled to source lines 222, 224. Each of the resistance-based memory cells 240-244 is coupled to a first word line 201 and to a second word line 202. The first resistance-based memory cell 240 and the third resistance-based memory cell 244 have the same coupling configuration as the resistance-based memory cell 101 of FIG. 1 (i.e., the "top" access transistor coupled to the "right" source line and the "bottom" access transistor coupled to the "left" source line). The second resistance-based memory cell 242 has a same coupling configuration as the resistance-based memory cell 103 (i.e., the "top" access transistor coupled to the "left" source line and the "bottom" access transistor coupled to the "right" source line).

In the first resistance-based memory cell 240, the source line 204 is coupled to a first terminal of a second access transistor 212, and the source line 206 is coupled to a first terminal of a first access transistor 208. A second terminal of the second access transistor 212, a first terminal of a resistance-based memory (e.g., an MTJ) element 210, and a second terminal of the first access transistor 208 are coupled to a node 248. A second terminal of the resistance-based memory element 210 is coupled to a first bit line 214.

In the second resistance-based memory cell 242, the source line 216 is coupled to a first terminal of a first access transistor 230, and the source line 218 is coupled to a first terminal of a second access transistor 234. A second terminal of the first access transistor 230, a first terminal of a resistance-based memory (e.g., an MTJ) element 232, and a second terminal of the second access transistor 234 are coupled to a node 250. A second terminal of the resistance-based memory element 232 is coupled to a second bit line 220.

In the third resistance-based memory cell 244, the source line 222 is coupled to a first terminal of a second access transistor 241, and the source line 224 is coupled to a first terminal of a first access transistor 236. A second terminal of the first access transistor 236, a first terminal of a resistance-based memory (e.g., an MTJ) element 238, and a second terminal of the second access transistor 241 are coupled to a node 252. A second terminal of the resistance-based memory element 238 is coupled to a third bit line 226.

Figure 3:
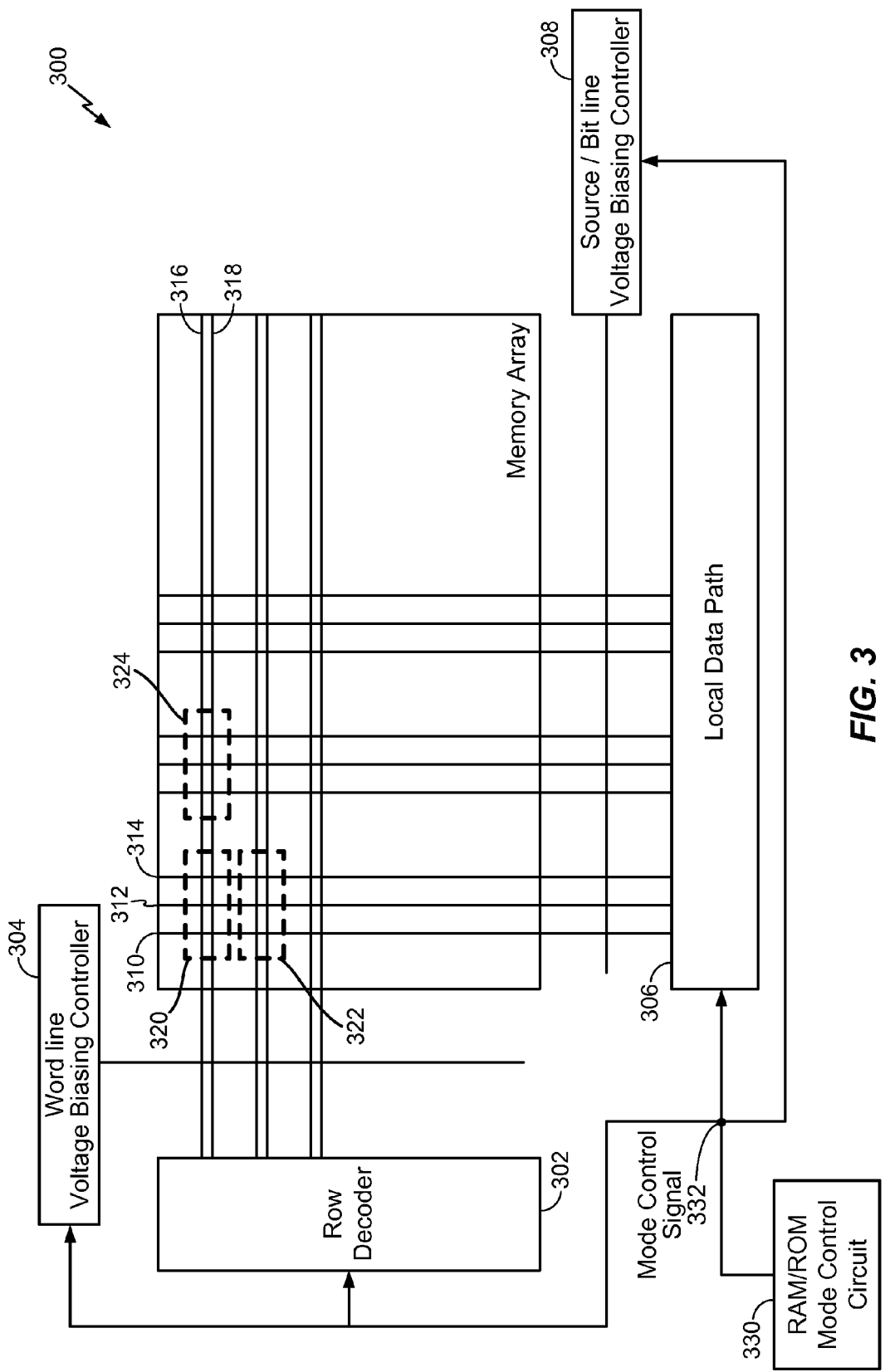
FIG. 3 is a diagram of a resistance-based memory cell array that may include the resistance-based memory cells of FIG. 1 or 2.

In a RAM operating mode (e.g., in response to a first value of a mode control signal), each of the resistance-based memory cells 240, 242, and 244 is accessible for data read and data write operations based on a state of the respective resistance-based memory element 210, 232, and 238, in a manner similar to RAM operation described for the resistance-based memory cells 101 and 103 of FIG. 1 and as described in further detail with respect to FIG. 3.

In a ROM operating mode (e.g., in response to a second value of a mode control signal), the resistance-based memory cell 240 may be accessed to determine a data value associated with the coupling configuration of the resistance-based memory cell 240 to the source lines 204, 206, the resistance-based memory cell 242 may be accessed to determine a data value associated with the coupling configuration of the resistance-based memory cell 242 to the source lines 216, 218, and the resistance-based memory cell 244 may be accessed to determine a data value associated with the coupling configuration of the resistance-based memory cell 244 to the source lines 222, 224. For example, the ROM data value of the first resistance-based memory cell 240 may be read by determining whether a particular source line of the pair of source lines 204, 206 is coupled to the access transistor 208 or to the access transistor 212 (e.g., in a manner similar to the ROM operation of the resistance-based memory cells 100 of FIG. 1 and as described in further detail with respect to FIG. 3). The ROM data value of the second resistance-based memory cell 242 may be read by determining whether a particular source line of the pair of source lines 216, 218 is coupled to the access transistor 230 or to the access transistor 234. The ROM data value of the third resistance-based memory cell 244 may be read by determining whether a particular source line of the pair of source lines 222, 224 is coupled to the access transistor 236 or to the access transistor 241.

The ROM data values (e.g., the coupling configuration of each resistance-based memory cell 240-244) may be fixed once the circuitry for the resistance-based memory cells 240-244 is laid out and the device 200 is fabricated. As a result, the ROM data values associated with each of the resistance-based memory cells 240-244 may remain fixed once embodied in use as a silicon integrated circuit or in a semiconductor device. The ROM data values may be set and/or changed during the design phase and/or as part of electronic computer-aided design (CAD) files representing the device 200.

FIG. 3 illustrates a system including a memory array 300 which includes a plurality of resistance-based memory cells, such as the resistance-based memory cells of FIG. 1 and FIG. 2. Each resistance-based memory cell is located at an intersection of a pair of word lines and a pair of source lines, with examples of individual resistance-based memory cells shown in the memory array 300 as resistance-based memory cell 320, resistance-based memory cell 322, and resistance-based memory cell 324. For example, the resistance-based memory cell 320 may correspond to row 0 and column 0 of the memory array 300 and is coupled to a word line 316 (the word line 316 may correspond to the word line 116 of FIG. 1) and a word line 318 (the word line 318 may correspond to the word line 118 of FIG. 1). The resistance-based memory cell 320 corresponding to row 0 and column 0 of the memory array 300 is also coupled to a source line 310 (the source line 310 may correspond to the source line 104 of FIG. 1) and a source line 312 (the source line 312 may correspond to the source line 106 of FIG. 1). The resistance-based memory cell 320 corresponding to row 0 and column 0 of the memory array 300 is further coupled to a bit line 314.

A row decoder 302 is configured to receive at least a portion of an address (e.g., a full or partial address) and to select a row (e.g., row 0 corresponding to the word line 316 and the word line 318) corresponding to the address. A local data path 306 includes a column decoder that is configured to receive at least a portion of the full or partial address and to select a column (e.g., column 0 corresponding to the source line 310, the source line 312, and the bit line 314) corresponding to the full or partial address. The local data path 306 may also include additional circuitry such as sense amplifiers for reading data from selected cells of the array 300.

A word line controller 304 includes circuitry configured to control biasing of word lines of selected and unselected rows of the array 300 in response to an output of the row decoder 302 and further in response to a mode of operation. The word line circuitry including the word line controller 304 and the row decoder 302 may be configured to enable reading of a data value from one or more resistance-based memory cells in a random access memory (RAM) mode and to enable reading of a data value from one or more resistance-based memory cells in a read only memory (ROM) mode. For example, in a RAM operating mode, the word line controller 304 may be configured to provide pairs of word lines with a same bias. For example, the word line circuitry may be coupled to multiple rows where each row of resistance-based memory cells is coupled to two word lines. When a row of resistance-based memory cells that includes the resistance-based memory cell 320 of FIG. 3 is selected in the RAM operating mode, the word line controller 304 may bias the word lines 316, 318 to turn on the resistance-based memory cell's access transistors. The access transistors for the resistance-based memory cell 320 may correspond to the access transistors 110 and 112 of the resistance-based memory cell 101 in FIG. 1 or the access transistors 130 and 136 of the resistance-based memory cell 103 of FIG. 1. When the row that includes the resistance-based memory cell 101 of FIG. 1 is not selected in the RAM operating mode, the word line controller 304 may bias the word lines 316 and 318 to turn off both access transistors of the resistance-based memory cell 320.

In a ROM operating mode, the word line controller 304 may be configured to provide different voltages to word lines of a selected pair of word lines. For example, if the resistance-based memory cell 320 is configured similarly to the resistance-based memory cell 101 of FIG. 1 or the resistance-based memory cell 103 of FIG. 1 and is selected while the circuitry of the array 300 is operating in the ROM operating mode, the word line controller 304 may bias the word line 316 with a first voltage (e.g., ground) to turn off a first access transistor and may bias the word line 318 with a second voltage (e.g., a supply voltage (Vdd)) to turn on a second access transistor. When the row that includes the resistance-based memory cell 320 is not selected in the ROM operating mode, the word line controller 304 may bias the word lines 316 and 318 to turn off both access transistors of the resistance-based memory cell 320.

A source/bitline controller 308 includes circuitry configured to control biasing of source lines and bit lines of selected and unselected columns of the array 300 in response to a column selection of the local data path 306, a mode of operation (e.g., RAM or ROM), and a type of operation (e.g., read, write "0", or write "1"). In an example, two particular source lines and one particular bit line are coupled to a column of resistance-based memory cells, where a different set of two source lines and a bit line correspond to different columns of resistance-based memory cells. For example, in a RAM operating mode, the source/bitline controller 308 may be configured to provide pairs of source lines with a same bias. For example, when a column that includes the resistance-based memory cell 320 is selected in the RAM operating mode, the source/bitline controller 308 may bias the source lines 310 and 312 to ground and may apply a read voltage (Vread) to the bit line 314. When the column that includes the resistance-based memory cell 320 is not selected in the RAM operating mode, the source/bitline controller 308 may bias the source lines 310 and 312 and the bit line 314 to ground.

In a ROM operating mode, the source/bitline controller 308 may be configured to provide different voltages to source lines of a selected pair of source lines. For example, when a column that includes the resistance-based memory cell 320, where the resistance-based memory cell 320 is configured similarly to the resistance-based memory cell 101 of FIG. 1 or the resistance-based memory cell 103 of FIG. 1, is selected in the ROM operating mode the source/bitline controller 308 may bias the source line 310 with a first voltage (e.g., Vread) and may bias the source line 312 and the bit line 314 with a second voltage (e.g., ground). When the column that includes the resistance-based memory cell 320 is not selected in the ROM operating mode, the source/bitline controller 308 may bias the source lines 310 and 312 to a same voltage as the bit line 314 (e.g., ground).

A RAM/ROM mode control circuit 330 may send a mode control signal 332 corresponding to a mode in which the memory array 300 is to be used. The mode control signal 332 may be received by one or more components of the memory array 300, such as the word line controller 304, the row controller 302, the source/bit line controller 308, and/or the local data path 306. In a particular embodiment, a first value of the mode control signal 332 indicates a first mode (e.g., a ROM mode), and a second value of the mode control signal 332 indicates a second mode (e.g., a RAM mode). In another embodiment, the mode control signal 332 instructs the memory array 300 to toggle between RAM and ROM modes (e.g., if the current mode is ROM mode, the memory array 300 switches to RAM mode in response to the mode control signal 332). In an embodiment, the memory array 300 initializes in ROM mode (e.g., upon power-up, boot, or reboot).

The circuitry controlling the memory array 300 may include components comprised of the word line controller 304, the row controller 302, the source/bit line controller 308, the local data path 306, and the RAM/ROM mode control circuit 330. The components may be entirely or partially integrated into a single larger circuit, may be embodied in a common die, and/or may be on a common printed circuit board.

Figure 4:
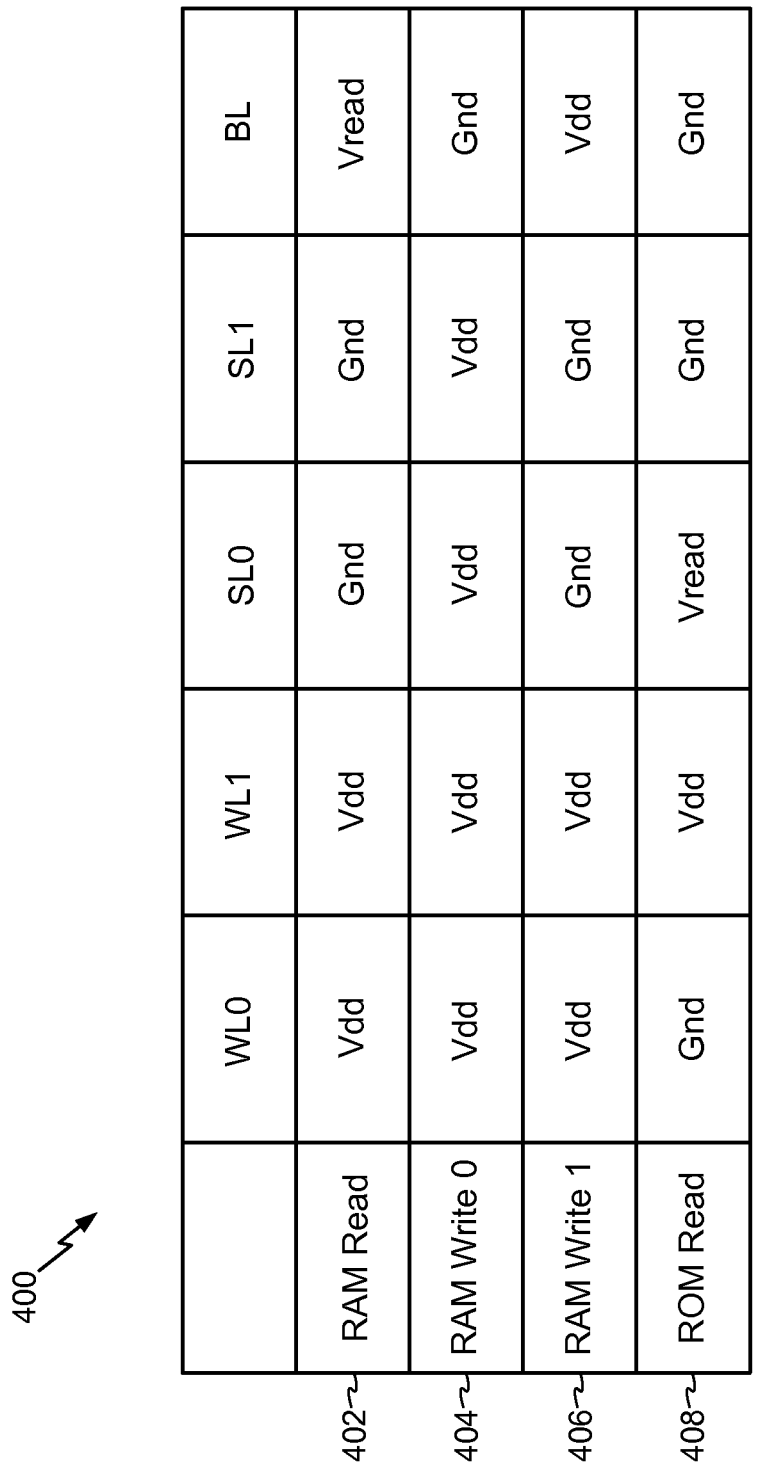
FIG. 4 is a table illustrating states of word lines, bit lines, and source lines that may be used with the resistance-based memory cells of FIG. 1 or 2.

An example of operation of the array 300 is illustrated in a table 400 in FIG. 4. The table 400 illustrates a voltage state for the word lines, source lines, and the bit line associated with each resistance-based memory cell in a particular embodiment. The table 400 includes states for both RAM and ROM operating modes. The two word lines are designated WL0 (e.g., the word line 116 in FIG. 1, the word line 201 in FIG. 2, and/or the word line 316 in FIG. 3) and WL1 (e.g., the word line 118 in FIG. 1, the word line 202 in FIG. 2, and/or the word line 318 in FIG. 3), the two source lines are designated SL0 (e.g., the source line 104 in FIG. 1, one of the source lines 204, 216 or 222 in FIG. 2, and/or the source line 310 in FIG. 3) and SL1 (e.g., the source line 106 in FIG. 1, one of the source lines 206, 218, or 224 of FIG. 2, or the source line 312 in FIG. 3) and the bit line is designated BL (e.g., bit line 108 in FIG. 1, one of the bit lines 214, 220, or 226 of FIG. 2, or the bit line 314 of FIG. 3). Voltages applied to WL0, WL1, SL0, SL1, and BL by the word line controller 304 and the source/bitline controller 308 are illustrated for a RAM read operation 402, a RAM write "0" operation 404, a RAM write "1" operation 406, and a ROM read operation 408.

Figure 5:
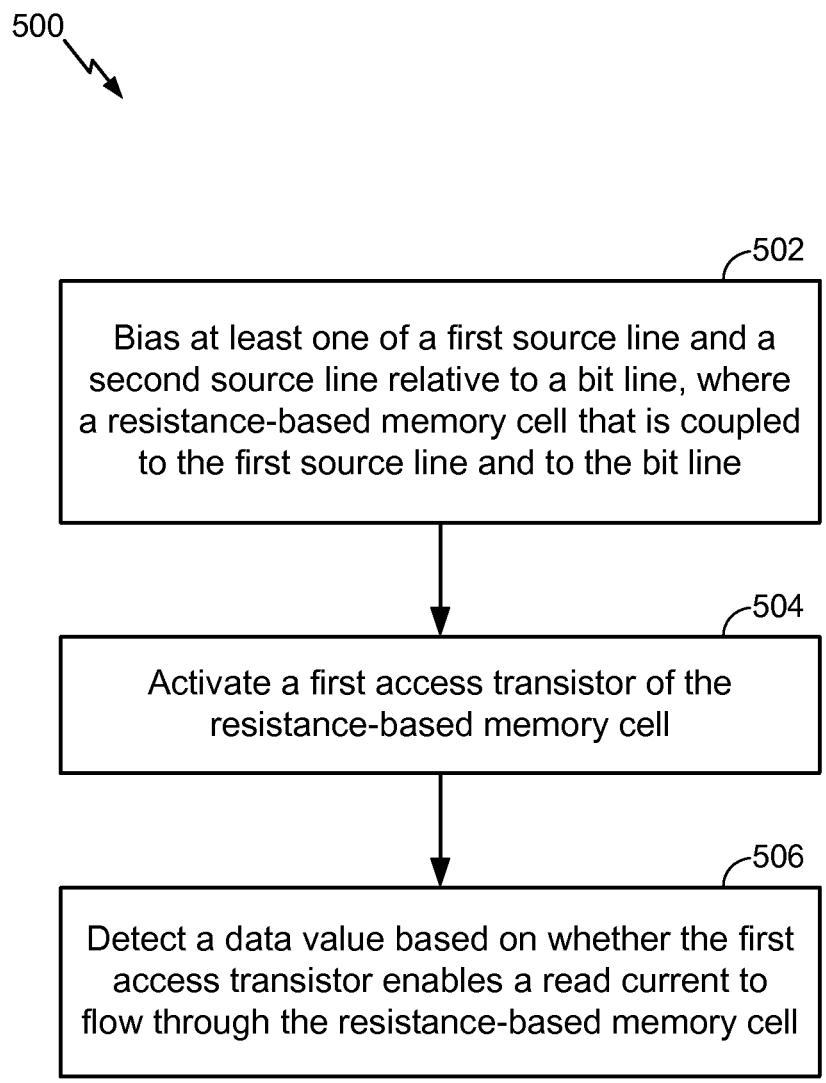
FIG. 5 is a flow chart illustrating a particular embodiment of a method of reading a data value from a resistance-based memory cell.

FIG. 5 illustrates an embodiment of a method 500 for reading a ROM data value from a resistance-based memory cell, such as the resistance-based memory cell 101 or 103 of FIG. 1, the resistance-based memory cells 240, 242, and 244 of FIG. 2, and/or the resistance-based memory cells 320, 322, or 324 of FIG. 3, as illustrative, non-limiting examples. At least one of a first source line or a second source line is biased relative to a bit line, at 502. The resistance-based memory cell is coupled to the first source line and to the bit line. For example, the source line/bit line controller 308 of FIG. 3 is configured to bias at least one of a first source line or a second source line relative to a bit line, such as according to the ROM Read 408 of FIG. 4. In this case, a first access transistor is activated, at 504. For example, the first access transistor may be activated by the word line controller 304 using the word line 316 of FIG. 3.

A data value is detected based on whether the first access transistor enables a read current to flow through the resistance-based memory cell, at 506. For example, the data value may be detected by sense circuitry in the local data path logic 306 of FIG. 3. To illustrate, a comparison may be made as to whether current through the resistance-based memory cell exceeds a threshold amount. When the first access transistor is coupled to a biased source line, a read current may flow through the resistance-based memory cell. Otherwise, when the biased source line is not coupled to an activated access transistor, a sub-threshold leakage current that is much smaller than the read current may flow through the resistance-based memory cell. The threshold may be set to a value less than a lowest expected read current (e.g., one-half of the lowest expected read current) to detect whether activating the first access transistor enables a read current (as opposed to a sub-threshold leakage current) through the resistance-based memory cell.

Figure 6:
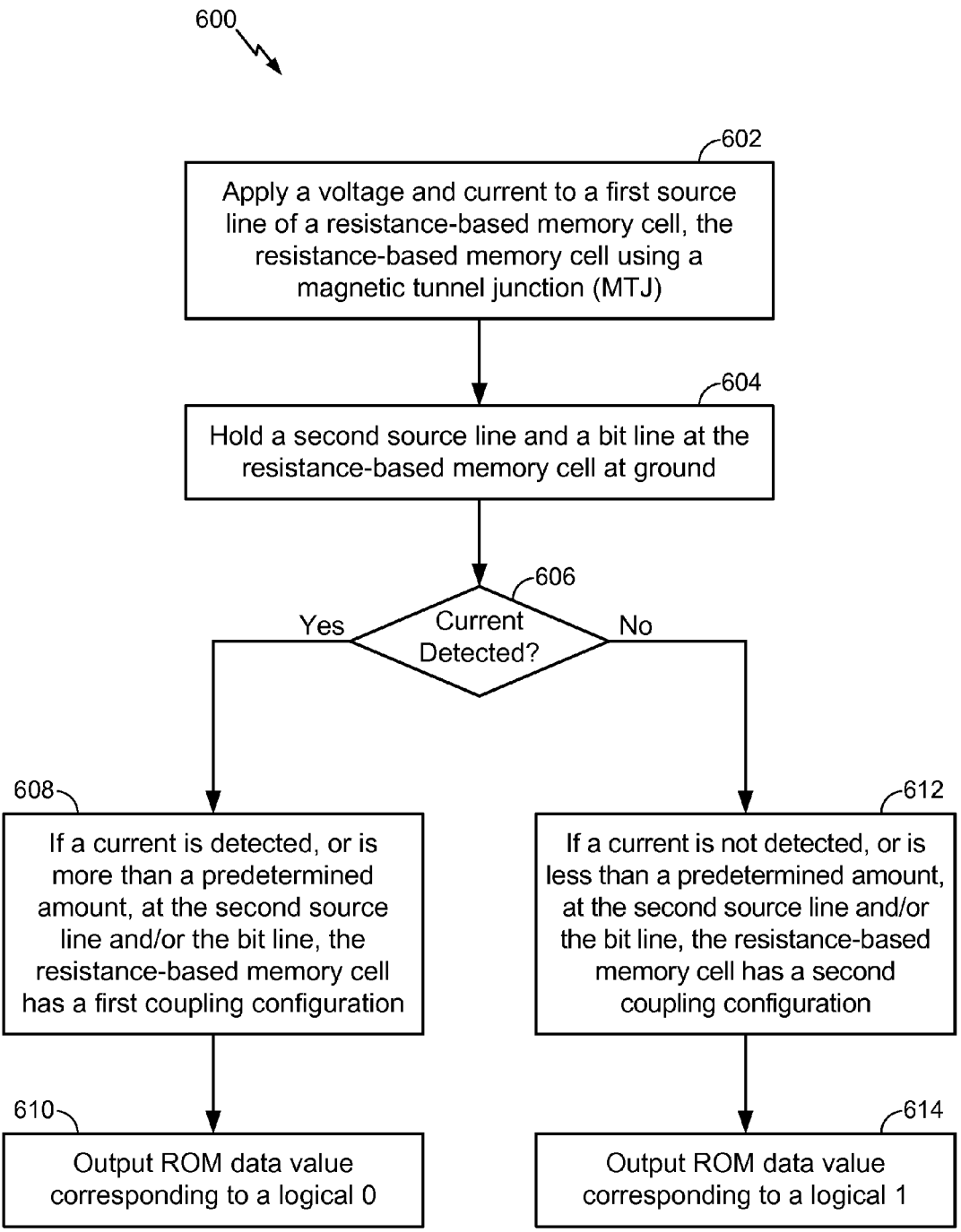
FIG. 6 is a flow chart illustrating a second particular embodiment of a method reading a data value from a resistance-based memory cell.

FIG. 6 illustrates an embodiment of a method 600 for reading a ROM value from a resistance-based memory cell (e.g., a resistance-based memory cell as in FIG. 1, 2, or 3 that is read according to a ROM operating mode). A ROM read includes detecting a value encoded into the resistance-based memory cell based on its coupling configuration by reading a current value associated with the resistance-based memory cell. The current value may be associated with at least two distinct logical values based on the coupling configuration of the layout of the resistance-based memory cell (e.g., a coupling configuration that corresponds to the resistance-based memory cell 101 of FIG. 1 and that is associated with a first logical value 0 or a coupling configuration that corresponds to the resistance-based memory cell 103 of FIG. 1 and that is associated with a second logical value 1).

A voltage and current may be applied to a first source line of a resistance-based memory cell, at 602. The resistance-based memory cell may include a magnetic tunnel junction (MTJ) as the resistive element. For example, the resistance-based memory cell may be one of the resistance-based memory cells of FIGS. 1-2. The resistance-based memory cell includes a first access transistor, and a source of the first access transistor is coupled the first source line. A drain of the first access transistor is coupled to a first terminal of the MTJ element. A second source line and a bit line coupled to the resistance-based memory cell may be held at ground, at 604. The resistance-based memory cell may include a second access transistor, and a source of the second access transistor may be coupled to the second source line. A drain of the second access transistor may be coupled to the first terminal of the MTJ element. A second terminal of the MTJ element may be coupled to the bit line. A determination of whether current is detected from at least one of the second source line and the bit line may be made, at 606.

In a particular embodiment, if a current is detected, or if a magnitude of a detected current is greater than a threshold amount of current at the second source line and/or the bit line, the resistance-based memory cell is detected as having a first coupling configuration, at 608. For example, detecting a current at the bit line may include detecting a current above a threshold current. In another embodiment, a detection of any current comprises detection of a current. A ROM data value corresponding to a first logical value (e.g., a logical "0" as illustrated in FIG. 1) may be output, at 610.

If a current is not detected, or if a magnitude of a detected current is less than the threshold amount, the resistance-based memory cell is detected as having a second coupling configuration, at 612. In this case, a ROM data value corresponding to a second logical value (e.g., a logical "1" as illustrated in FIG. 1) may be output, at 614.

Figure 7:
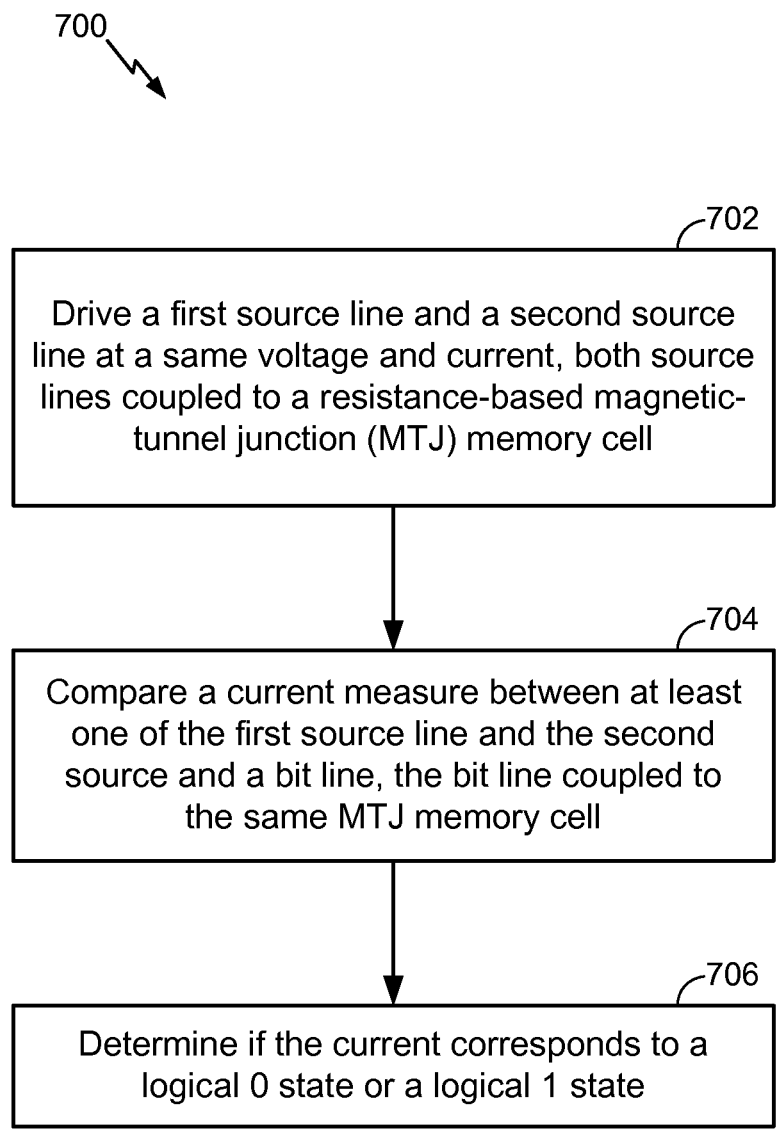
FIG. 7 is a flow chart illustrating a third particular embodiment of a method reading a data value from a resistance-based memory cell.

FIG. 7 illustrates a method 700 for conducting a read operation on a resistance-based memory cell with a magnetic tunnel junction (MTJ) element providing a resistance as in FIGS. 1, 2, and 3 while in a RAM operating mode. The resistance-based memory cell is operably connected to multiple source lines. A first word line coupled to a first access transistor and a second word line coupled to a second access transistor are set to bias the access transistors to enable current to flow through the access transistors, at 702. A read current may be detected at a bit line at 704, and the bit line is operably connected to the resistance-based memory cell such that current provided at the first and second source lines may flow through the MTJ element to be detectable at the bit line. The read current is compared to a reference current, at 706. If the read current is less than the reference current, the MTJ is in a higher-resistance, anti-parallel state that corresponds to a first logical value, such as a logical "1" RAM data value. If the current is greater than the reference current, the MTJ is in a lower-resistance, parallel state that corresponds to a second logical value, such as a logical "0" RAM data value.

Figure 8:
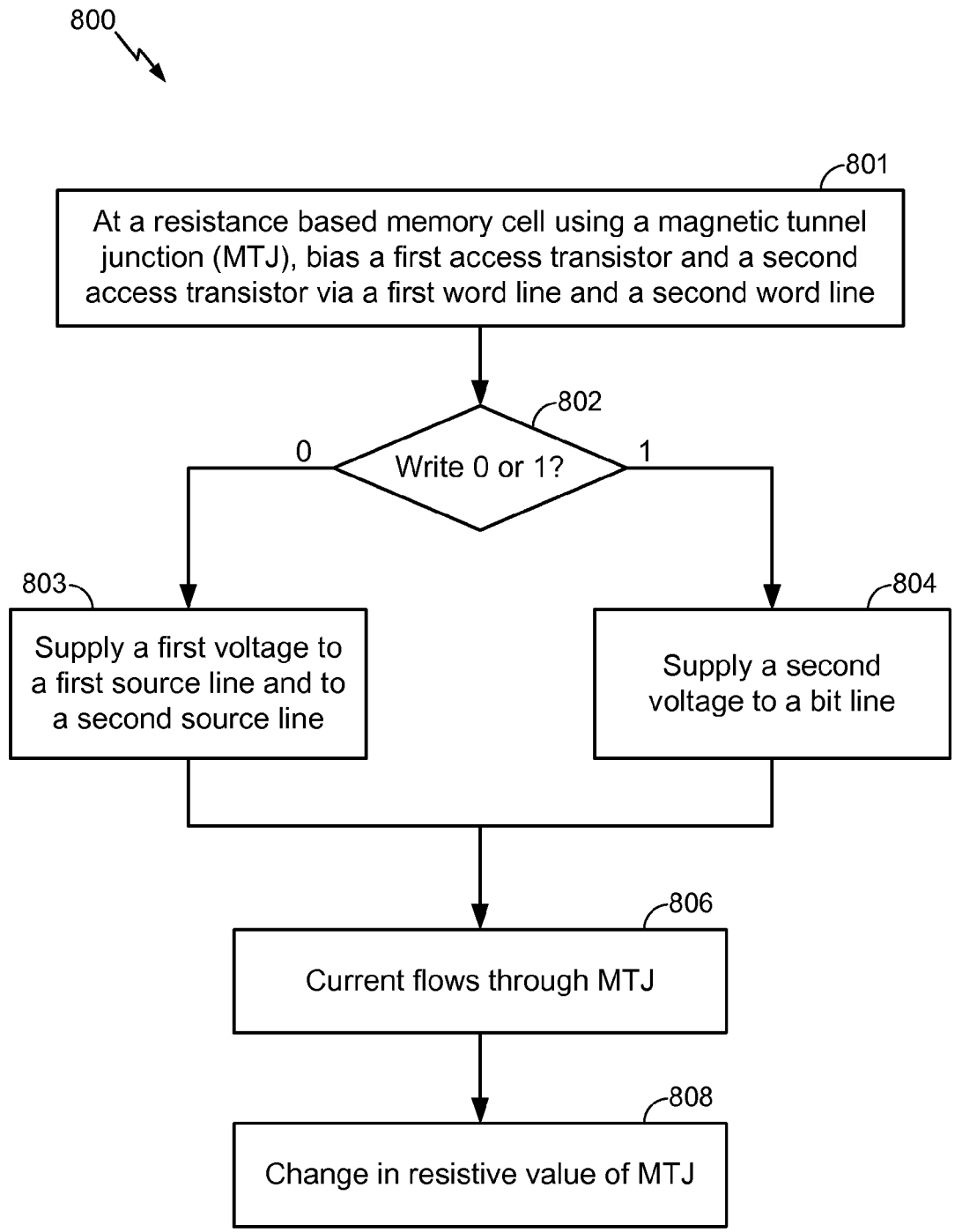
FIG. 8 is a flow chart illustrating a particular embodiment of a method of writing a data value to a resistance-based memory cell.

FIG. 8 illustrates a method 800 for changing a state of a resistance-based memory cell that includes a magnetic tunnel junction (MTJ) element. A first transistor is biased using a first word line and a second transistor is biased using a second word line, enabling current flow through both transistors, at 801. The transistors are coupled to a first terminal of the MTJ element, and a bit line is coupled to a second terminal of the MTJ element. As an example, the resistance-based memory cell may correspond to the resistance-based memory cell 101 of FIG. 1 or the resistance-based memory cell 103 of FIG. 1.

When a logical 0 is to be written to the resistance-based memory cell, at 802, a first current and voltage may be applied to a first source line and to a second source line, at 803. The first source line coupled to the first transistor and the second source line coupled to the second transistor. The bit line may be biased at a relatively lower voltage than the source lines, such as at a local ground voltage level. The resulting current may correspond to a write current to write a logical 0 data value to the resistance-based memory cell.

When a logical 1 is to be written to the resistance-based memory cell, at 802, a second current and voltage is applied to the bit line, where the voltage of the bit line is higher than the voltage of the first and second source lines, at 804. The first and second source lines may be set to a local ground voltage level. Write current for writing a logical 1 data value may flow through the MTJ element in an opposite direction as compared to the write current for writing a logical 0 data value.

Write current may flow through the MTJ element from the first and second source lines to the bit line (if writing a logical 0 data value), or from the bit line to the first and second source lines (if writing a logical 1 data value), at 806. The current flowing through the MTJ element may result in a resistive change corresponding to setting the MTJ resistance-based memory cell to a logical 0 or a logical 1 value, at 808.

Figure 9:
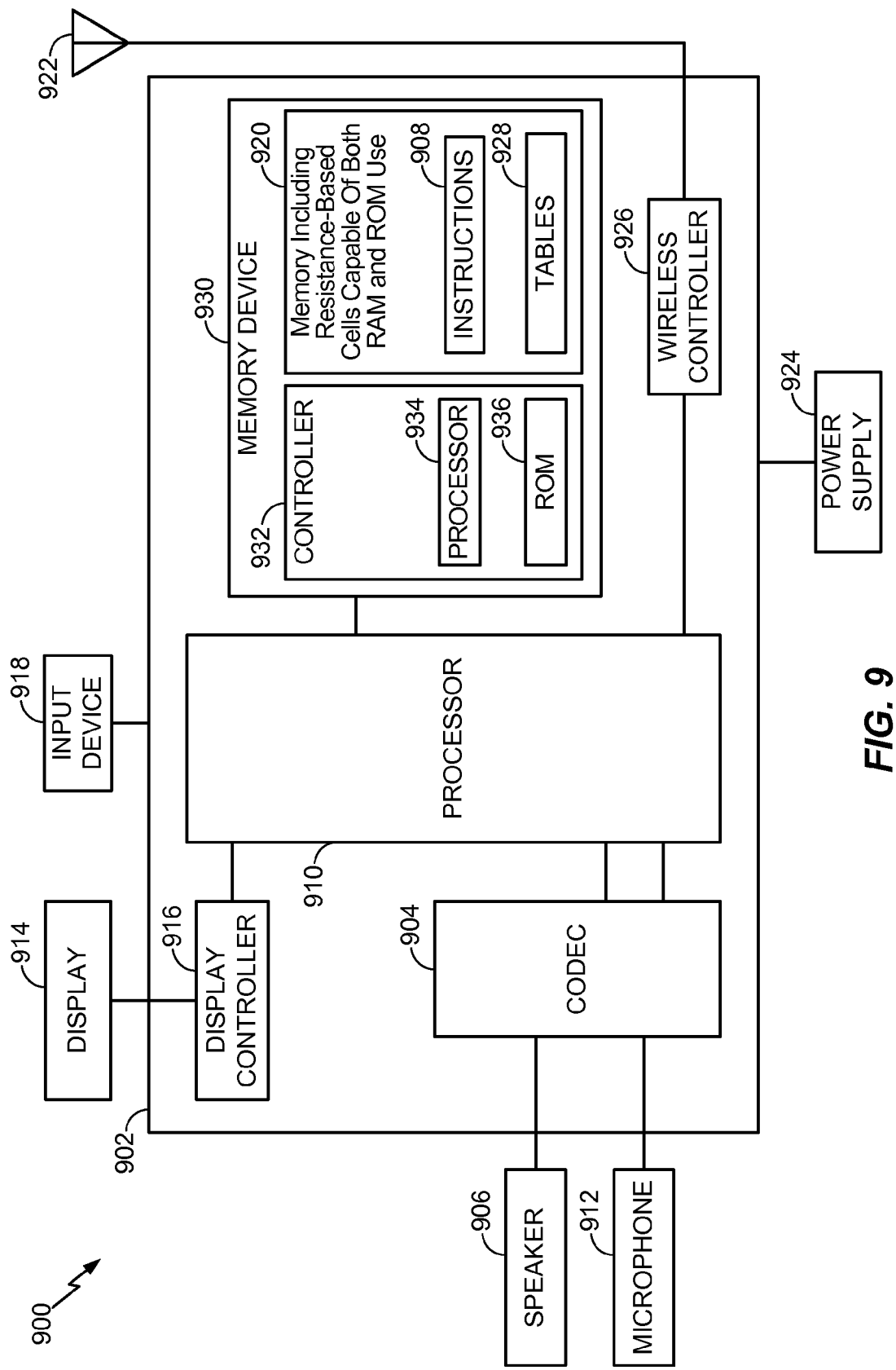
FIG. 9 is a diagram of a communication device including resistance-based memory cells.

Referring to FIG. 9, a block diagram of a particular illustrative embodiment of a device is depicted and generally designated 900. The device 900 may include a processor 910 (e.g., a digital signal processor (DSP)) coupled to a memory device 930. The memory device 930 may include a memory array 920 having one or more resistance-based memory cells useable in both RAM and ROM operating modes, such as the resistance-based memory cells 100 of FIG. 1, the plurality of resistance-based memory cells 200 of FIG. 2, or the resistance-based memory cell array 300 of FIG. 3, as illustrating non-limiting examples.

The memory array 920 may include non-transitory tangible computer-readable cells to form a processor-readable storage medium. The memory array 920 may store instructions 908 that are executable by a processor 934 in a memory controller 932. Alternatively, or in addition, the instructions 908 may be executable by the processor 910. The instructions 908 may be executable by the processor 934 and/or the processor 910 to perform operations to read a ROM data value from a resistance-based memory cell of the memory array 920 that is coupled to a first source line, to a second source line, and to a bit line of the memory array 920. The instructions 908 may be executable to bias at least one of the first source line and the second source line relative to the bit line. The instructions 908 may be executable to activate a first access transistor at the resistance-based memory cell. The instructions 908 may be further executable to perform detecting of a data value based on whether the first access transistor enables a read current to flow through the resistance-based memory cell. Although the instructions 908 are illustrated as stored in the memory array 920, in other embodiments part or all of the instructions 908 may be stored outside the memory array 920, such as in a ROM 936 that is useable by the processor 934.

In an embodiment, the instructions 908 in the memory array 920 may be stored at the resistance-based memory cells that are usable as both RAM and ROM cells, where some instructions may be read from the resistance-based memory using the RAM functionality of the resistance-based memory while other sets of instructions, such as boot code, may be readable using the ROM functionality of the resistance-based memory. The memory array 920 may also encode any type of information using the ROM functionality of the resistance-based memory, such as to store one or more tables 928, such as one or more trigonometric function tables. Trigonometric functions may be evaluated using the tables 928 as look-up media, rather than using the processor 910 or a math coprocessor (not illustrated) to calculate trigonometric functions each time a trigonometric function is called. Using sine or cosine functions as examples, a lookup result from the tables 928 may take approximately 10 nanoseconds (ns) to retrieve, while a calculation in a processor 910 or a math coprocessor (not illustrated) may take approximately 100 ns to calculate the same result, as an illustrative, non-limiting example. The one or more tables 928 may store one or more mathematical functions, instead of or in addition to trigonometric functions. For example, fast Fourier transform coefficients and/or other mathematical function data may be stored in the tables 928. Since each resistance-based memory cell can hold data as RAM and as ROM simultaneously, the useable data density of the memory array 920 is increased and the memory 928 may enable reduced use of board or chip space, as compared to memory with RAM-only or ROM-only cells. Alternatively, or in addition, more data may be stored in the memory array 920, such as the tables 928 and/or the instructions 908, without increasing a size of the memory array 920 as compared to memories that do not store ROM values based on coupling configurations.

FIG. 9 also shows a display controller 916 that is coupled to the processor 910 and to a display 928. A coder/decoder (CODEC) 904 may be coupled to the processor 910. A speaker 906 and a microphone 912 may be coupled to the CODEC 904.

FIG. 9 indicates that a wireless controller 926 may be coupled to the processor 910 and to an antenna 922. In a particular embodiment, the processor 910, the display controller 916, the memory array 920, the CODEC 904, and the wireless controller 926 are included in a system-in-package or system-on-chip device 902. In a particular embodiment, an input device 918 and a power supply 924 are coupled to the system-on-chip device 902. Moreover, in a particular embodiment, as illustrated in FIG. 9, the display 914, the input device 918, the speaker 906, the microphone 912, the antenna 922, and the power supply 924 are external to the system-on-chip device 902. However, each of the display 914, the input device 918, the speaker 906, the microphone 912, the antenna 922, and the power supply 924 can be coupled to a component of the system-on-chip device 902, such as an interface or a controller.

In conjunction with the described embodiments, a device is disclosed that may include means for biasing at least one of a first source line and a second source line relative to a bit line, where a resistance-based memory cell is coupled to the first source line and to the bit line. For example, the means for biasing may include the source line/bit line controller 308 of FIG. 3 or any other controller and/or circuitry configured to bias at least one of a first source line and a second source line. The device may also include means for activating a first access transistor of the resistance-based memory cell. For example, the means for activating may include the word line controller 304 of FIG. 3 or any other controller and/or circuitry configured to activate a first access transistor. The device may also include means for detecting a data value based on whether the first access transistor enables a read current to flow through the resistance-based memory cell. For example, the means for detecting may include the sense circuitry in the local data path logic 306 of FIG. 3 or any other data path logic and/or circuitry configured to detect a data value based on whether the first access transistor enables a read current to flow through the resistance-based memory cell.

Figure 10:
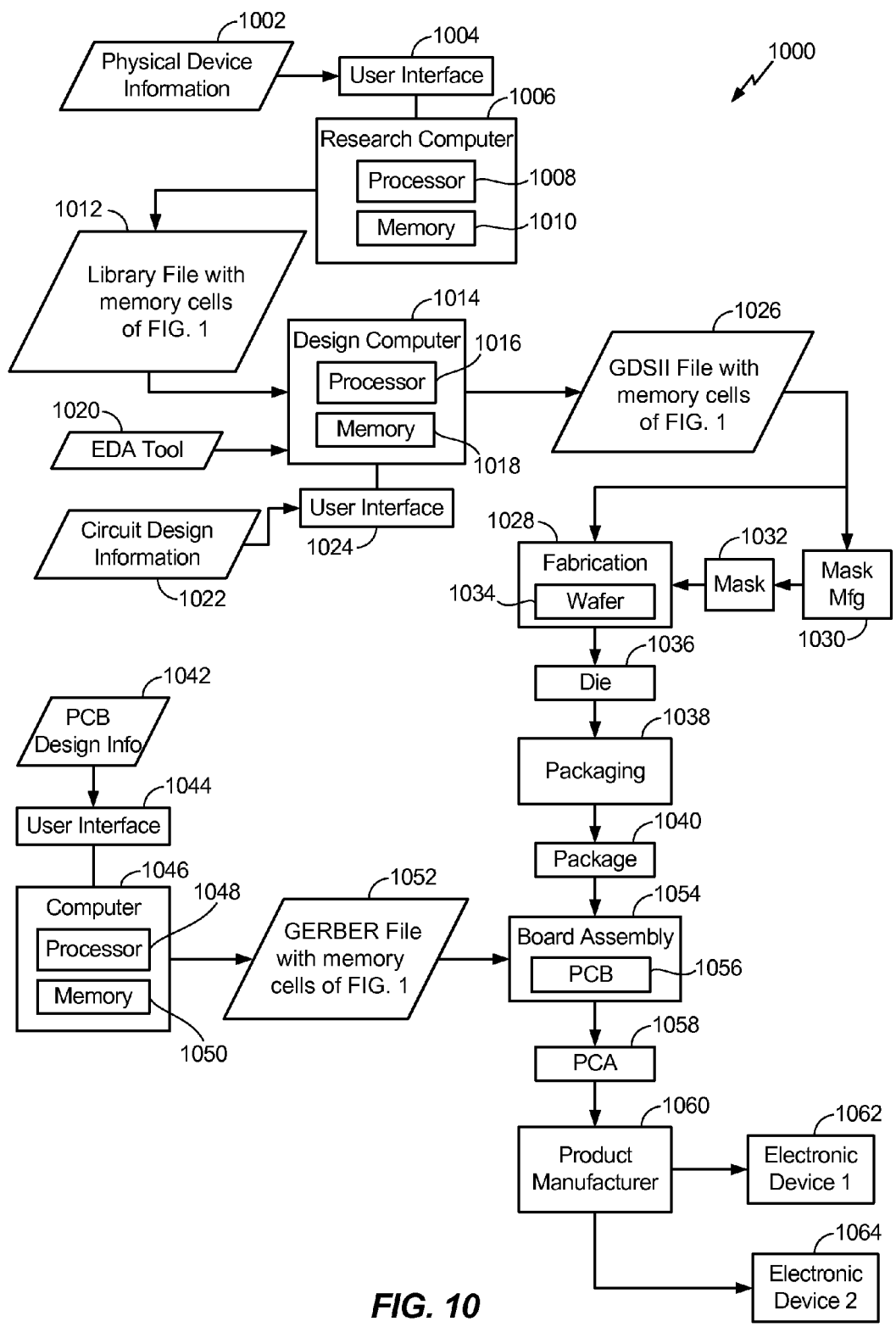
FIG. 10 is a flow diagram of a particular illustrative embodiment of a manufacturing process to manufacture electronic devices that include resistance-based memory cells.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 10 depicts a particular illustrative embodiment of an electronic device manufacturing process 1000.

Physical device information 1002 is received at the manufacturing process 1000, such as at a research computer 1006. The physical device information 1002 may include design information representing at least one physical property of a semiconductor device, such as the resistance-based memory cells of FIG. 1, the resistance-based memory cells of FIG. 2, the memory array of FIG. 3, or any combination thereof. For example, the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a device that includes the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination, of the library file 1012. For example, a user of the design computer 1014 may enter circuit design information 1022 via a user interface 1024 coupled to the design computer 1014. The circuit design information 1022 may include design information representing at least one physical property of a semiconductor device, such as the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022, to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof, in addition to other circuits or information. To illustrate, the data file may include information corresponding to a system-on-chip (SOC) that includes the memory array of resistance-based memory cells usable as RAM and ROM 300 of FIG. 3, and that also includes additional electronic circuits and components within the SOC.

The GDSII file 1026 may be received at a fabrication process 1028 to manufacture the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof, according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1034, which may be tested and separated into dies, such as a representative die 1036. The die 1036 includes a circuit including a device that includes the resistance-based MTJ memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a tablet, a cell phone, a laptop computer, a set top box, a music player, a video player, an entertainment unit, a navigation device, a communications device, a personal digital assistant (PDA), a fixed location data unit, and a computer, into which the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof, is integrated. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these illustrated units. Embodiments of the disclosure may be suitably employed in any device which includes active integrated circuitry including memory and on-chip circuitry.

A device that includes the resistance-based memory cells 100 of FIG. 1, the plurality of resistance-based memory cells 200 of FIG. 2, the resistance-based memory cell array 300 of FIG. 3, the memory array 920 and/or the memory device 930 of FIG. 9, or any combination thereof, may be fabricated, processed, and incorporated into an electronic device, as described in the illustrative process 1000. One or more aspects of the embodiments disclosed with respect to FIGS. 1-8 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage device known in the art. An exemplary storage device is coupled to the processor such that the processor can read information from, and write information to, the storage device. In the alternative, the storage device may be integral to the processor. The processor and the storage device may reside in an application-specific integrated circuit (ASIC). The ASIC may reside in a computing device or a user terminal. In the alternative, the processor and the storage device may reside as discrete components in a computing device or user terminal.

The previous description of the disclosed embodiments is provided to enable a person skilled in the art to make or use the disclosed embodiments. Various modifications to these embodiments may be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
a memory cell comprising a resistance-based storage element coupled to multiple access transistors, wherein a coupling configuration of the multiple access transistors to multiple conductive lines stores a first data value while the resistance-based storage element stores a second data value, wherein the first data value comprises a read-only memory (ROM) data value and wherein the second data value comprises a random access memory (RAM) data value.

2. The device of claim 1, wherein the coupling configuration comprises a first configuration in which a first access transistor of the multiple access transistors is coupled to a first source line of the multiple conductive lines and a second access transistor of the multiple access transistors is coupled to a second source line of the multiple conductive lines.

3. The device of claim 2, wherein the resistance-based storage element corresponds to a magnetic tunnel junction (MTJ) element.

4. The device of claim 3, wherein the MTJ element is further coupled to the first source line or to the second source line.

5. The device of claim 3, further comprising a word line controller and a source/bit line controller configured to enable reading of the first data value in a first mode of operation and to enable reading of the second data value in a second mode of operation.

6. The device of claim 1, wherein the first data value has a first binary value or a second binary value and the second data value has the first binary value or the second binary value.

7. The device of claim 2, wherein the device includes a second memory cell having a second plurality of access transistors and a second coupling configuration in which a first access transistor of the second plurality of access transistors is coupled to a third source line of the multiple conductive lines and a second access transistor of the second plurality of access transistors is coupled to a fourth source line of the multiple conductive lines, wherein the second coupling configuration stores a third data value while a second resistance-based storage element of the second memory cell stores a fourth data value.

8. A device comprising:
a word line controller; and
a row of memory cells coupled to the word line controller, wherein a memory cell in the row of the memory cells comprises a resistance-based storage element coupled to multiple access transistors, wherein a coupling configuration of the multiple access transistors to multiple conductive lines stores a first data value while the resistance-based storage element stores a second data value, wherein the first data value comprises a read-only memory (ROM) data value and wherein the second data value comprises a random access memory (RAM) data value.

9. The device of claim 8, further comprising a column of memory cells coupled to a first source line of the multiple conductive lines and coupled to a second source line of the multiple conductive lines, wherein the memory cell in the row of memory cells is in the column of memory cells.

10. The device of claim 9, further comprising a plurality of rows of memory cells and a plurality of columns of the memory cells, the plurality of rows and columns configured to operate as a ROM in one mode of operation and as a RAM in another mode of operation.

11. The device of claim 10, wherein the plurality of rows and the plurality of columns are packaged as a single chip.

12. The device of claim 11, wherein the first data value corresponds to a first binary value or a second binary value and the second data value corresponds to the first binary value or the second binary value.

13. A method for reading data, the method comprising:
biasing a first source line or a second source line relative to a bit line, wherein the first source line and the bit line are coupled to a memory cell including a resistance-based storage element;
activating a first access transistor of the memory cell; and
detecting a first data value based on whether the first access transistor enables a read current to flow through the resistance-based storage element, the resistance-based storage element storing a second data value, wherein the first data value comprises a read-only memory (ROM) data value and wherein the second data value comprises a random access memory (RAM) data value.

14. The method of claim 13, wherein the first data value corresponds to a first binary value or a second binary value and the second data value corresponds to the first binary value or the second binary value.

15. The method of claim 13, further comprising:
biasing a first word line and a second word line to change a state of a magnetic tunnel junction (MTJ) element of the memory cell, wherein the second data value is based on the state of the MTJ element.

16. The method of claim 15, wherein detecting the state of the MTJ element further comprises detecting a voltage at the bit line during a read operation.

17. A device comprising:
resistance-based means for storing data; and
a plurality of means for accessing the resistance-based means for storing data, wherein a coupling configuration of the plurality of means for accessing to multiple conductive lines stores a first data value while the resistance-based means for storing data stores a second data value, wherein the first data value comprises a read-only memory (ROM) data value and wherein the second data value comprises a random access memory (RAM) data value.

18. The device of claim 17, wherein the resistance-based means for storing data and the plurality of means for accessing are integrated into one of a tablet, a cell phone, a laptop computer, a set top box, a music player, a video player, an entertainment unit, a navigation device, a communications device, a personal digital assistant (PDA), a fixed location data unit, or a computer.

19. A computer readable storage device storing instructions that are executable by a processor to perform operations comprising:
biasing a first source line or a second source line relative to a bit line, wherein the first source line and the bit line are coupled to a memory cell including a resistance-based storage element;
activating a first access transistor of the memory cell; and
detecting a first data value of the memory cell based on whether the first access transistor enables a read current to flow through the resistance-based storage element, the resistance-based storage element storing a second data value, wherein the first data value comprises a read-only memory (ROM) data value and wherein the second data value comprises a random access memory (RAM) data value.

20. The computer readable storage device of claim 19, wherein the instructions are executable by a processor integrated into one of a tablet, a cell phone, a laptop computer, a set top box, a music player, a video player, an entertainment unit, a navigation device, a communications device, a personal digital assistant (PDA), a fixed location data unit, or a computer.

21. A method comprising:
a first step for biasing a first source line or a second source line relative to a bit line, wherein the first source line and the bit line are coupled to a memory cell including a resistance-based storage element;
a second step for activating a first access transistor of the memory cell; and
a third step for detecting a first data value based on whether the first access transistor enables a read current to flow through the resistance-based storage element, the resistance-based storage element storing a second data value, wherein the first data value comprises a read-only memory (ROM) data value and wherein the second data value comprises a random access memory (RAM) data value.

22. The method of claim 21, wherein the first step, the second step, and the third step are performed by a processor integrated into an electronic device.

23. A method comprising:

receiving design information comprising physical positioning information of a packaged semiconductor device on a circuit board, the packaged semiconductor device comprising a memory cell having a resistance-based storage element coupled to multiple access transistors, wherein a coupling configuration of the multiple access transistors to multiple conductive lines stores a first data value while the resistance-based storage element stores a second data value, wherein the first data value comprises a read-only memory (ROM) data value and wherein the second data value comprises a random access memory (RAM) data value; and transforming the design information to generate a data file.

24. The method of claim 23, wherein the data file has a GERBER format.

25. The method of claim 23, wherein the data file includes a GDSII format.

* * * * *